(12) United States Patent
Hsieh et al.

(10) Patent No.: US 6,495,915 B1
(45) Date of Patent: Dec. 17, 2002

(54) FLIP CHIP PACKAGE OF MONOLITHIC MICROWAVE INTEGRATED CIRCUIT

(75) Inventors: Tsung-Ying Hsieh, Hsin Chu (TW); Chin-Lien Hsu, Hsin Chu (TW); Wen-Rui Hsu, Tao Yuan (TW)

(73) Assignee: APack Communications Inc. (TW)

( * ) Notice: Subject to any disclaimer, the term of this patent is extended or adjusted under 35 U.S.C. 154(b) by 0 days.

(21) Appl. No.: 09/927,564

(22) Filed: Aug. 9, 2001

(30) Foreign Application Priority Data

May 30, 2001 (TW) .................................. 90713148 A (51) Int. Cl.⁷ .................. H01L 23/12; H01L 21/60; H03F 3/60

(52) U.S. Cl. .............. 257/728; 257/778; 257/734; 257/737; 257/738; 257/724; 257/725; 257/691; 257/774; 257/684; 257/796

(58) Field of Search ............... 257/778, 734, 257/737, 738, 728, 724, 725, 692, 693, 774, 684, 796, 691

(56) References Cited

FOREIGN PATENT DOCUMENTS

| JP | 10-308478 | * 11/1998 |
| JP | 11-195730 | * 7/1999 |
| JP | 2000-31207 | * 1/2000 |

* cited by examiner

*Primary Examiner*—Alexander O. Williams
(74) *Attorney, Agent, or Firm*—Martine & Penilla, LLP (57) ABSTRACT

A flip chip package of monolithic microwave integrated circuit (MMIC) is disclosed. The MMIC package includes a substrate with top and bottom surfaces; a MMIC chip, having an active surface; a plurality of metal strips on the active surface of the MMIC chip; a plurality of metal strips on the top surface of the substrate and electrically connected to the metal strips on the MMIC chip; a plurality of metal strips on the bottom surface of the substrate; a plurality of via holes, penetrating through the substrate and electrically connected to the metal strips on the substrate's top and bottom surface; an underfill, filling all the chinks between MMIC chip and the substrate and covering up the MMIC chip. Moreover, the MMIC package has a penetration hole through the central area of the substrate and filled with a heat-dissipative material for heat dissipation.

14 Claims, 12 Drawing Sheets

FLIP CHIP PACKAGE OF MONOLITHIC MICROWAVE INTEGRATED CIRCUIT

FIELD OF THE INVENTION

The invention relates to a flip chip package of monolithic microwave integrated circuit (MMIC), and more particularly, to a flip chip package of MMIC that has optimum heat-dissipative characteristic, and that can reduce the effects of parasitic inductance and parasitic capacitance, for the application in micro-wave, millimeter-wave and radio-frequency.

BACKGROUND OF THE INVENTION

In our modem society, internet has become an indispensable part of our daily life. As the quality demands on the transmitting speed of the audio, video and data are getting higher and higher, wide-band network emerges in response to the needs of the times.

Figure 1:
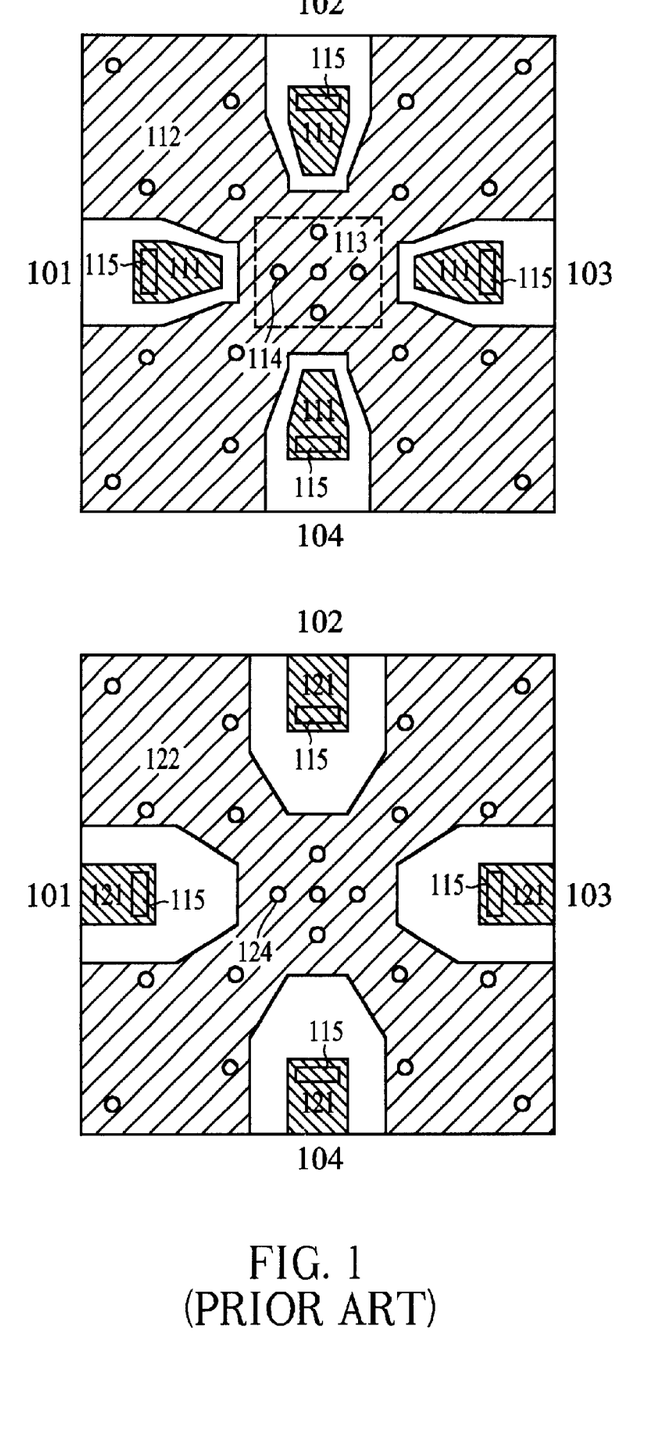
FIG. 1 is a structural disposition of a microwave integrated circuit package according to a prior art.

FIG. 1 is a structural disposition of a microwave integrated circuit package according to a prior art. As shown in FIG. 1, the microwave integrated circuit package structure disclosed in patent No. 69,402 of Taiwan, Republic of China includes a grounded potential metal surface 112, an IC chip bonding part 113, a slot-type via hole signal line 115 penetrating through the substrate, a coplanar waveguide input/output port (I/O port) 121, and a plurality of circular via holes connecting the top and bottom metal surfaces of the substrate. The microwave integrated circuit package provides a grounded potential metal surface to perform signal transmission between each of the I/O ports and IC circuit. As far as the disposition of the metal surface on the substrate's top surface is concerned, the material employed for the metal surface is any ones that can be performed wire bonding and are chemically stable. And the metal surface is fabricated by making use of thick film or thin film or a common IC board's etching methods, and its attenuation is smaller than that of a micro-strip since it employs coplanar waveguide.

Figure 2:
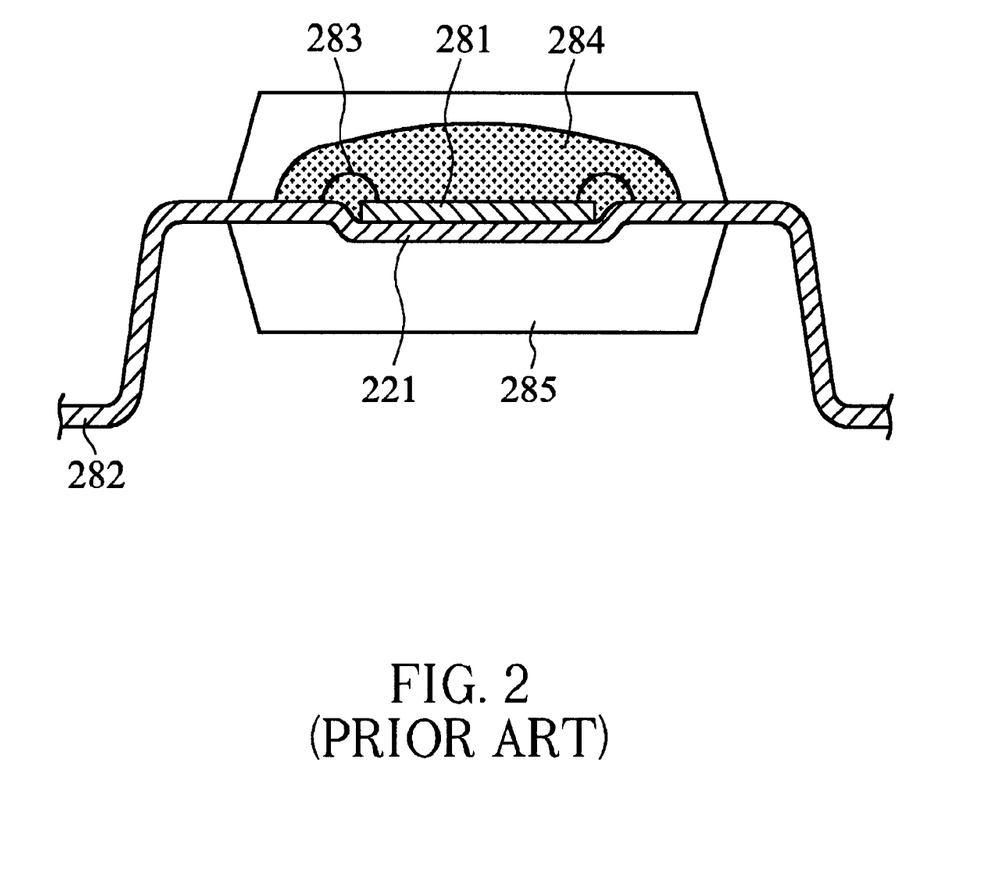
FIG. 2 is a cross-sectional view of a microwave integrated circuit package according to another prior art.

FIG. 2 is a cross-sectional view of a microwave integrated circuit package according to another prior art. The prior art shown in FIG. 2 is a "small outline integrated circuit (SOIC) package" which is the most popular IC package technology nowadays. As shown in FIG. 2, the steps for forming the SOIC package is described as follows. First of all, a chip 281 is adhered to the paddle 221 of the lead frame 282 by the surface mounting method. Afterwards, the wires 283 are bonded, and adhesive material 284 is applied to fix the package in position. The package is finally formed by mold injection with encapsulant 285 to protect against the intrusion of the moisture and the dust that might affect the electrical characteristic in order to improve the package reliability.

Figure 3A:
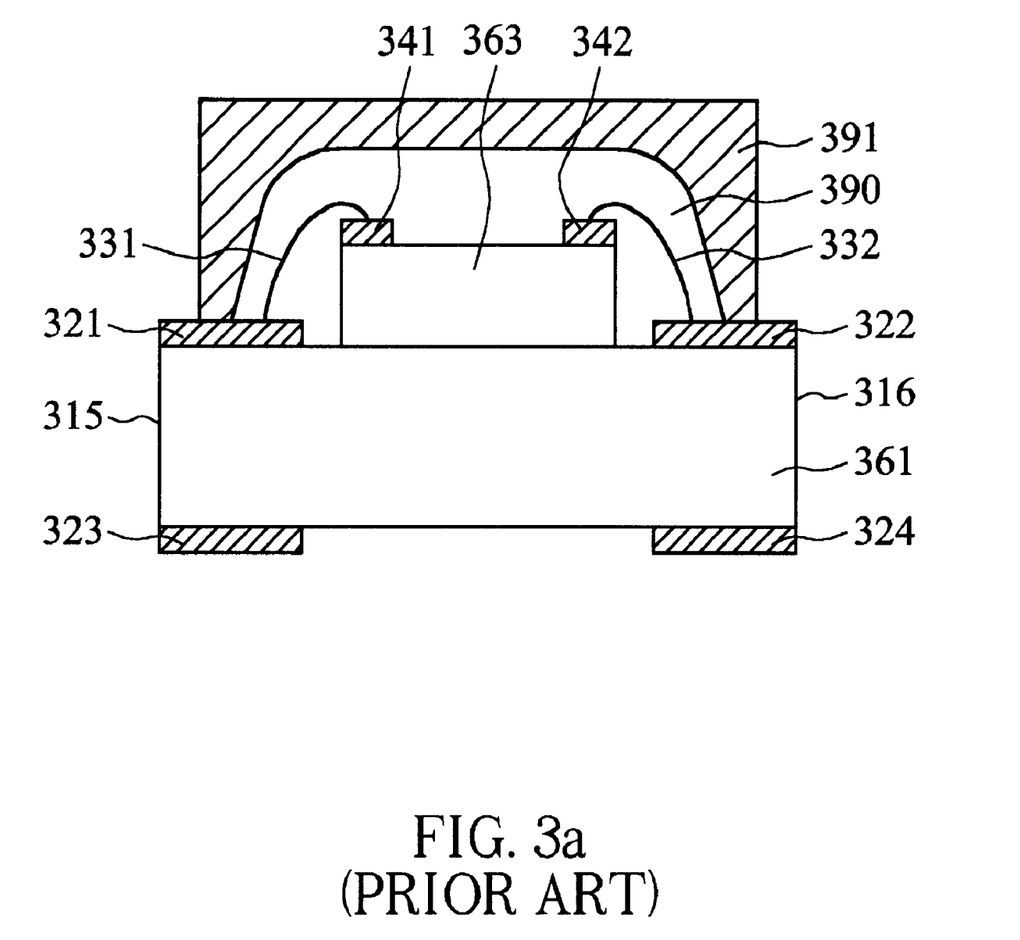
FIG. 3(a) is a cross-sectional view of a microwave integrated circuit package according to one other prior art.

FIG. 3(a) is a cross-sectional view of a microwave integrated circuit package according to one other prior art. The microwave integrated circuit package is disclosed in patent No. 93,511 of Taiwan, Republic of China. As shown in FIG. 3(a), the microwave integrated circuit package includes an IC chip 363 and a substrate 361. Wires 331, 332 are employed to connect the I/O ports 341, 342 of the IC to the I/O ports 321, 322 of the substrate's top surface. They are further connected to the I/O ports 323, 324 of the substrate's bottom surface through the via holes 315, 316 at the left and right edges of the substrate. Afterwards, underfill material 390 is employed to cover the IC chip 363 and bonding wires 331, 332 to fix the IC chip in position. Finally, the package is formed on the top of the underfill material 390 by mold injection with encapsulant 391.

Figure 3B:
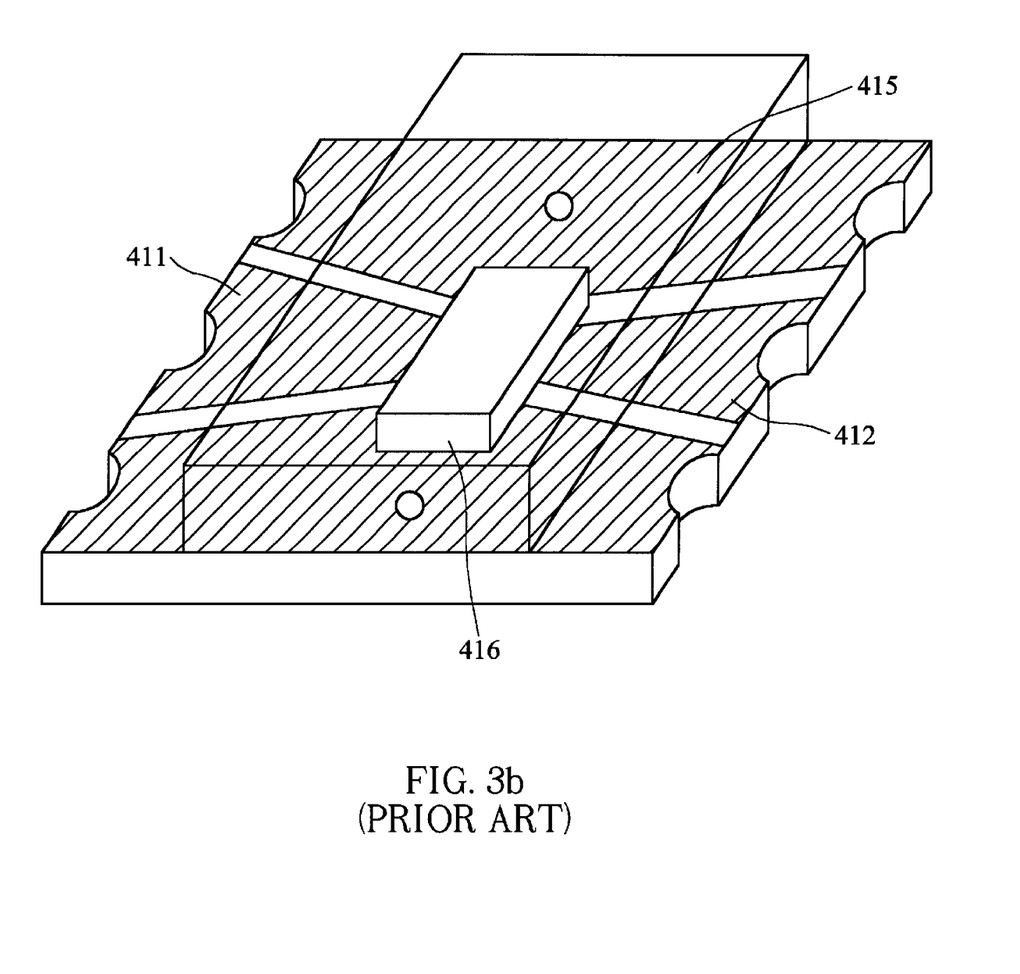
FIG. 3(b) is an isometric top view of a microwave integrated circuit package according to the one other prior art shown in FIG. 3(a).

FIG. 3(b) is an isometric top view of a microwave integrated circuit package according to the one other prior art shown in FIG. 3(a). As shown in FIG. 3(b), the IC chip 416 is flipped over to have the surface, having signal and ground terminals, facing downward. In the meantime, metal strip 411, 412 are widen such that the input signal terminal of the IC chip 416 can contact the metal strip 411, the output signal terminal can contact the metal strip 412, and the all the grounded terminals can contact the metal strip 415. Moreover, the portion covered by the IC chip 416 is performed etching to prevent the surface of the IC chip 416 from being short-circuited.

Most of the above-mentioned package technology makes use of bonding wires to connect the IC chip to the I/O ports of the substrate. Since the bonding wires of this kind of chip-and-wire IC package will cause significant parasitic inductance effect and parasitic capacitance effect in the frequency range of micro-wave and milli-meter wave, the chip-and-wire IC package will affect the electrical characteristic in the high frequency range and deteriorate the reliability of the electronic devices. Moreover, among the MMIC packages, the manufacturing cost of this kind of chip-and-wire is rather high nowadays, and its mass production is not feasible. Further, the size of the MMIC made by chip-and-wire is rather large that does not meet the trend of compact design in package.

Currently, in respect of the frequency range of micro-wave and milli-wave application, although the micro-wave integrated circuit (MIC) formed by employing bare chip and wire bonding is widely used, the fabrication process is time consuming and the cost of manpower is very high, thereby, the price of the MIC package remains very high. Besides, since the bonding wires currently employed by the micro-wave chip package results in parasitic inductance effect and parasitic capacitance effect, the electrical performance is deteriorated, consequently, the application of the wire bonding in milli-wave package is not even feasible.

On the other hand, a comparison of the invention with the prior art shown in FIG. 3(b) is made as follows. Since the invention employs metal strips to connect the IC chip to the substrate, and since the area of the substrate is only slightly greater than that of the IC chip, the size of the device after finishing the packaging process is rather small. Therefore, the MMIC package of the invention is in accordance with the trend of the compact design of the package. In addition, since the IC chip is electrically connected to the substrate through the metal strip instead of being directly contacted the substrate, the short circuit phenomenon on the surface of the IC chip can be avoided, thereby, the yield of the package of the electronic device is improved

SUMMARY OF THE INVENTION

In the light of the above-mentioned disadvantages, and in order to resolve the problems on the package used in radio frequency (RF), microwave, and milli-wave devices, an object of the invention is to have a package that can make use of the common surface-mounted technology (SMT) to undertake mass production so as to lower the production cost. The above-mentioned problems are summarized as follows:

1. The undesired impedance matching and the self-resonant problems resulted from the parasitic capacitance and parasitic inductance generated by the bonding wires.

2. The inability problem to undertake automation on the production of the chip-and-wire package.
3. The inertly heat-dissipative problem of the chip of gallium arsenide (GaAs) commonly used by the RF, microwave, and milli-wave.
4. The inability to have a compact package since the size of the package becomes large after the packaging process.

To attain the object of resolving these problems, the invention provides a flip chip package of monolithic microwave integrated circuit (MMIC). The MMIC package of the invention includes a substrate, having an top surface and a bottom surface, and each of the surfaces is divided respectively into a periphery area and a central area; an integrated circuit chip (IC chip), having a first surface and a second surface, and each of the surfaces being divided respectively into a periphery area and a central area, and the MMIC package being made by flipping the IC chip to have its first surface covering on the top surface of the substrate, and the central area of the first surface having one or several active devices; a plurality of metal strips, positioned on the IC chip's first surface and disposed in the periphery area of the IC chip's first surface, and these metal strips being electrically connected to the active devices on the first surface of the IC chip; a plurality of solder bumps, implanted respectively on and being electrically connected to the first surface's metal strips of the plurality of IC chips; a plurality of metal strips of the substrate 's top surface, disposed in the periphery area of the substrate's top surface, and these metal strips being electrically connected to the plurality of solder bumps; a plurality of metal strips of the substrate's bottom surface, disposed in the periphery area of the substrate's bottom surface; a plurality of via holes, penetrating through the substrate and being electrically connected to the plurality of metal strips of the substrate's top surface and to the plurality of metal strips of the substrate's bottom surface respectively; and an underfill, filling the solder bumps and the plurality of the metal strips which are connected to the solder bumps and are positioned on the IC chip's first surface, also filling all the chinks around the top surface's metal strips of the substrate, and covering the whole IC chip up to a height that is slightly higher than the thickness of the MMIC chip. A penetration hole is provided in the central areas of the top and bottom surfaces of the substrate for those high power packages that require optimum heat-dissipative effect. Moreover, the material removed by penetrating the penetration hole is replaced by filling a heat-dissipative material with relatively low dielectric constant and relatively low dielectric loss.

DETAILED DESCRIPTION OF THE PREFERRED EMBODIMENTS

The flip chip packages of the monolithic microwave integrated circuit are classified into low power packages and high power packages depending on the required power in their field of application. The low power packages have their power less that one milli-Watt (mW) while the high power packages have their power greater that one milli-Watt (mW). As compared with low power packages, high power packages require much better heat-dissipative package structure in order to improve the reliability since the high power packages contain MMIC that generates relatively high quantity of heat. The first embodiment of the invention is a low power package while the second embodiment of the invention is a high power package.

Figure 5A:
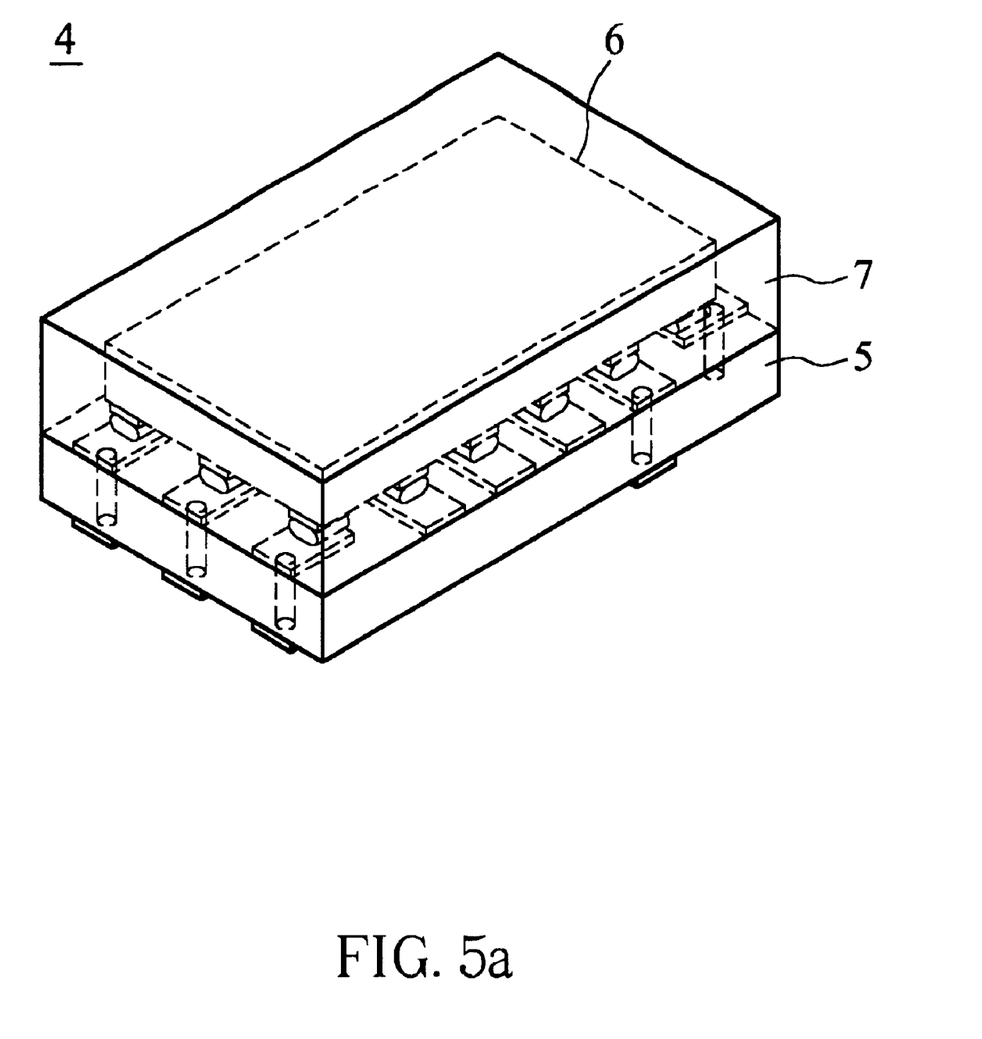
FIG. 5(a) is an isometric top view of a flip chip package of an MMIC of the first embodiment of the invention.
Figure 5B:
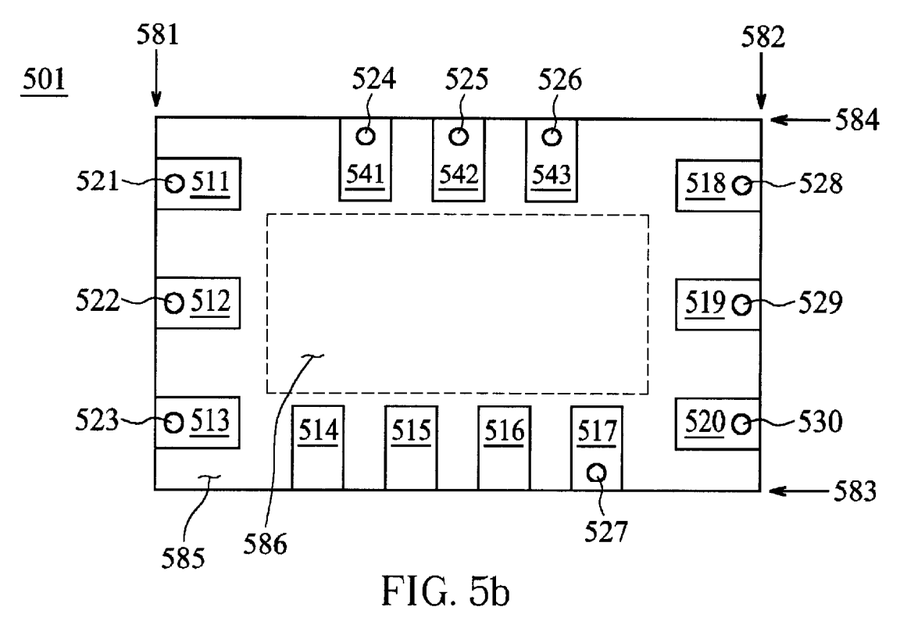
FIG. 5(b) is a top view of the substrate's top surface of a flip chip package of an MMIC of the first embodiment of the invention.
Figure 5C:
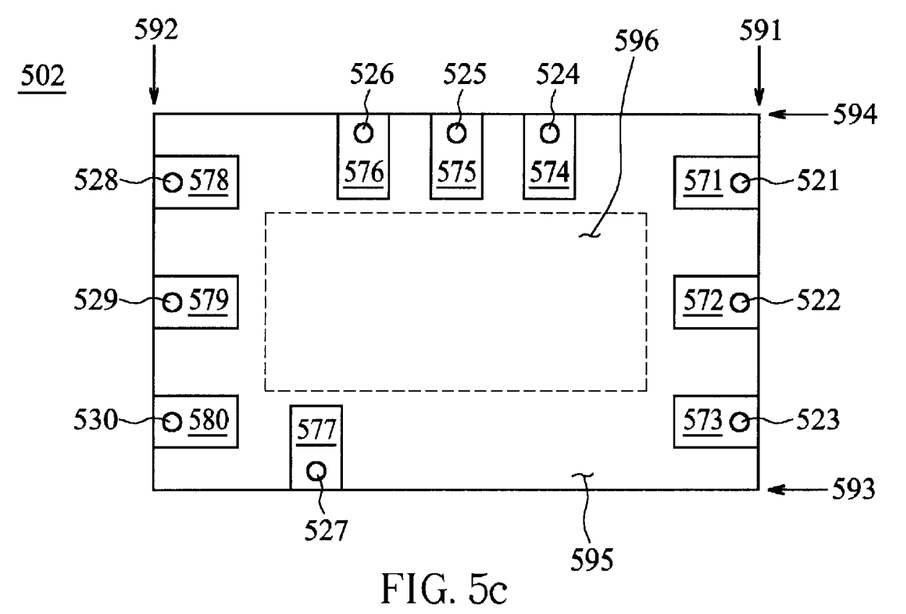
FIG. 5(c) is a bottom view of the substrate's bottom surface of an MMIC of the first embodiment of the invention.
Figure 5D:
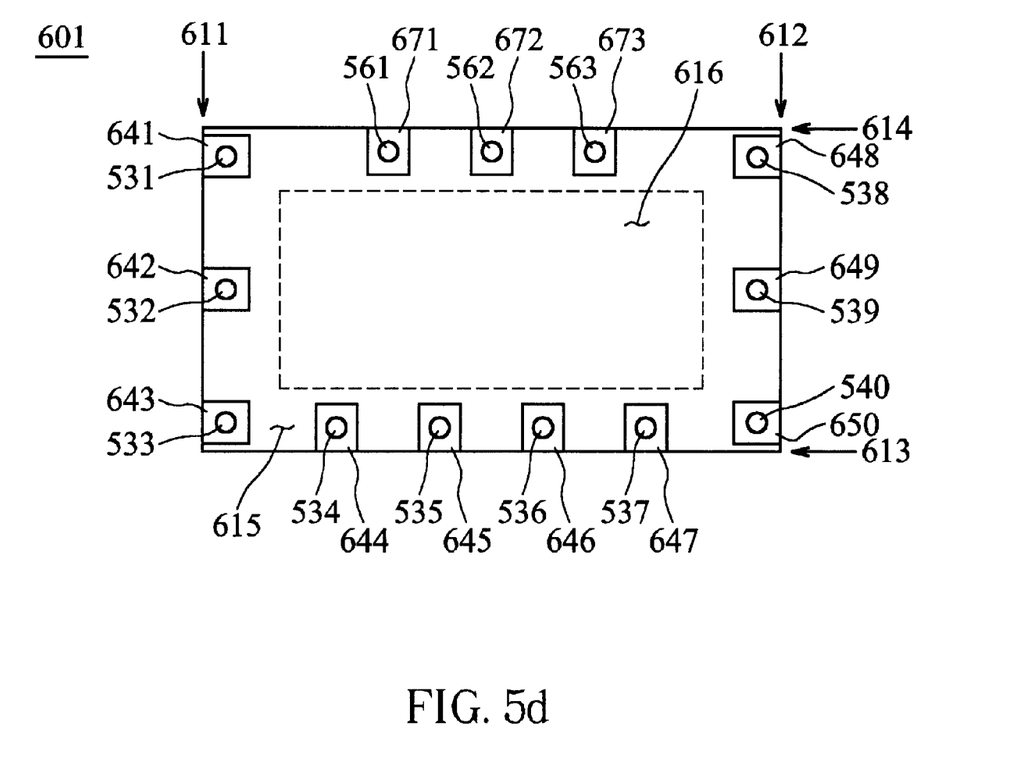
FIG. 5(d) is a top view of the IC chip's bottom surface of a flip chip package of an MMIC of the first embodiment of the invention.
Figure 6:
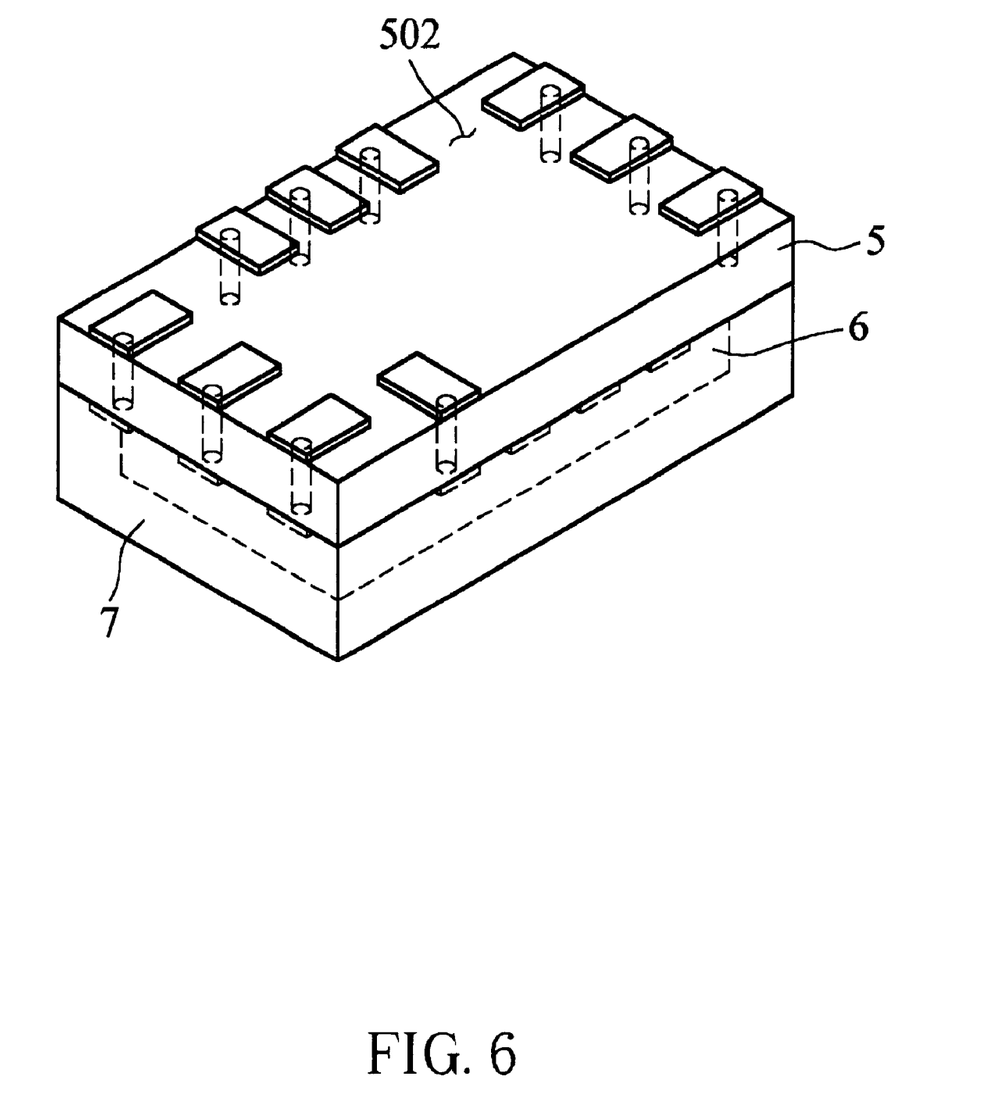
FIG. 6 is an isometric bottom view of a flip chip package of an MMIC of the first embodiment of the invention.
Figure 7:
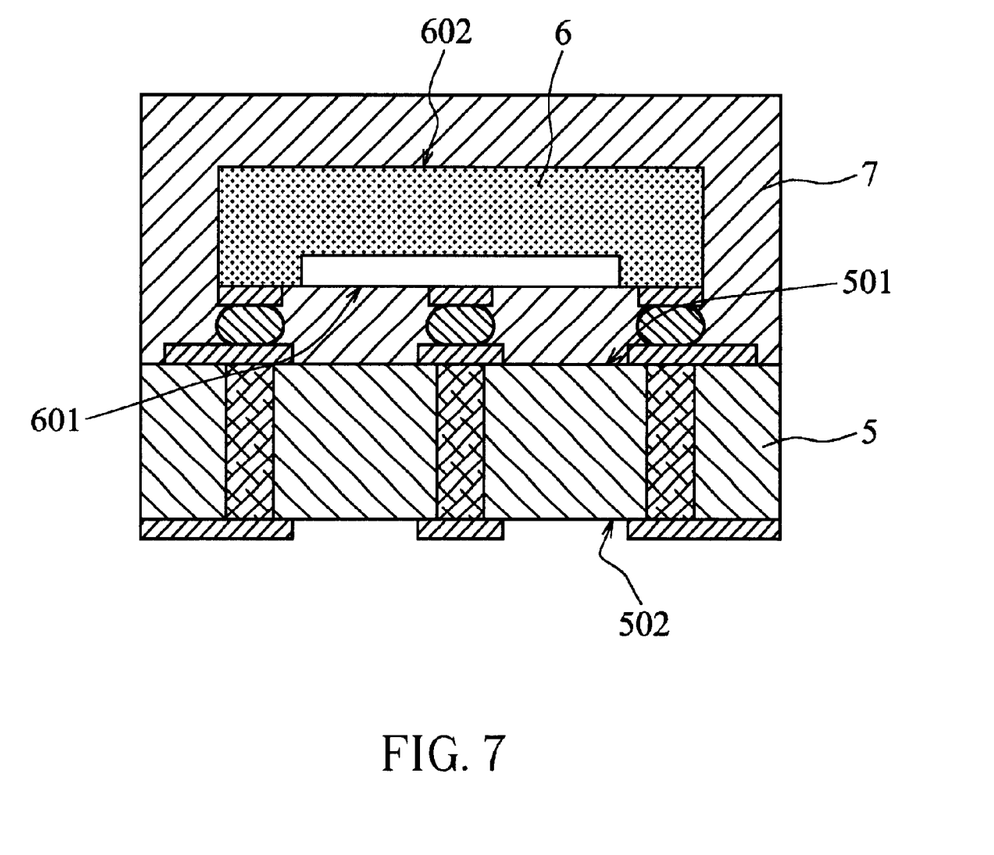
FIG. 7 is a cross-sectional view of a flip chip package of an MMIC of the first embodiment of the invention.

The flip chip package of a monolithic microwave integrated circuit of the first embodiment of the invention is illustrated in FIGS. 5(a), 5(b), 5(c), 5(d), FIG. 6, and FIG. 7. FIG. 5(a) is an isometric top view of a flip chip package of an MMIC of the first embodiment of the invention. FIG. 5(b) is a top view of the substrate's top surface of a flip chip package of an MMIC of the first embodiment of the invention. FIG. 5(c) is a bottom view of the substrate's bottom surface of an MMIC of the first embodiment of the invention. FIG. 5(d) is a top view of the IC chip's bottom surface of a flip chip package of an MMIC of the first embodiment of the invention. FIG. 6 is an isometric bottom view of a flip chip package of an MMIC of the first embodiment of the invention. FIG. 7 is a cross-sectional view of a flip chip package of an MMIC of the first embodiment of the invention.

As shown in FIGS. 5(a), 5(b), 5(c), 5(d), FIG. 6, FIG. 7, the flip chip package of a monolithic microwave integrated circuit of the invention 4 includes a substrate 5, an integrated circuit chip (IC chip) 6. The substrate 5 has a top surface 501 and a bottom surface 502, and the IC chip 6 has a first surface 601 and a second surface 602. The flip chip package of a monolithic microwave integrated circuit 4 also includes a plurality of first surface metal strips 641, 642, 643, 644, 645, 646, 647, 648, 649, 650, 671, 672, 673 of the IC chip 6, and a plurality of solder bumps 531, 532, 533, 534, 535, 536, 537, 538, 539, 540, 561, 562, 563 implanting on the plurality of first surface metal strips of the IC chip 6, a plurality of substrate's top surface metal strips 511, 512, 513, 518, 519, 520, 514, 515, 516, 517, 541, 542, 543, a plurality of substrate's bottom surface metal strips 571, 572, 573, 574, 575, 576, 577, 578, 579, 580, and a plurality of via holes 521, 522, 523, 524, 525, 526, 527, 528, 529, 530.

Among them, the top surface 501 of the substrate 5 includes a first side 581, a second surface 582, a third side 583, and a fourth side 584. Moreover the whole top surface 501 of the substrate 5 is divided into a periphery area 585 and a central area 586. In the similar way, the bottom surface 502 of the substrate 5 includes a first side 591, a second surface 592, a third side 593, and a fourth side 594. Moreover, the whole bottom surface 502 of the substrate 5 is divided into a periphery area 595 and a central area 596.

What is more, the first surface 601 of the IC chip 6 includes a first side 611, a second side 612, a third side 613, and a fourth side 614. Moreover, the whole first surface 601 of the IC chip 6 is divided into a periphery area 615 and a central area 616.

Figure 4:
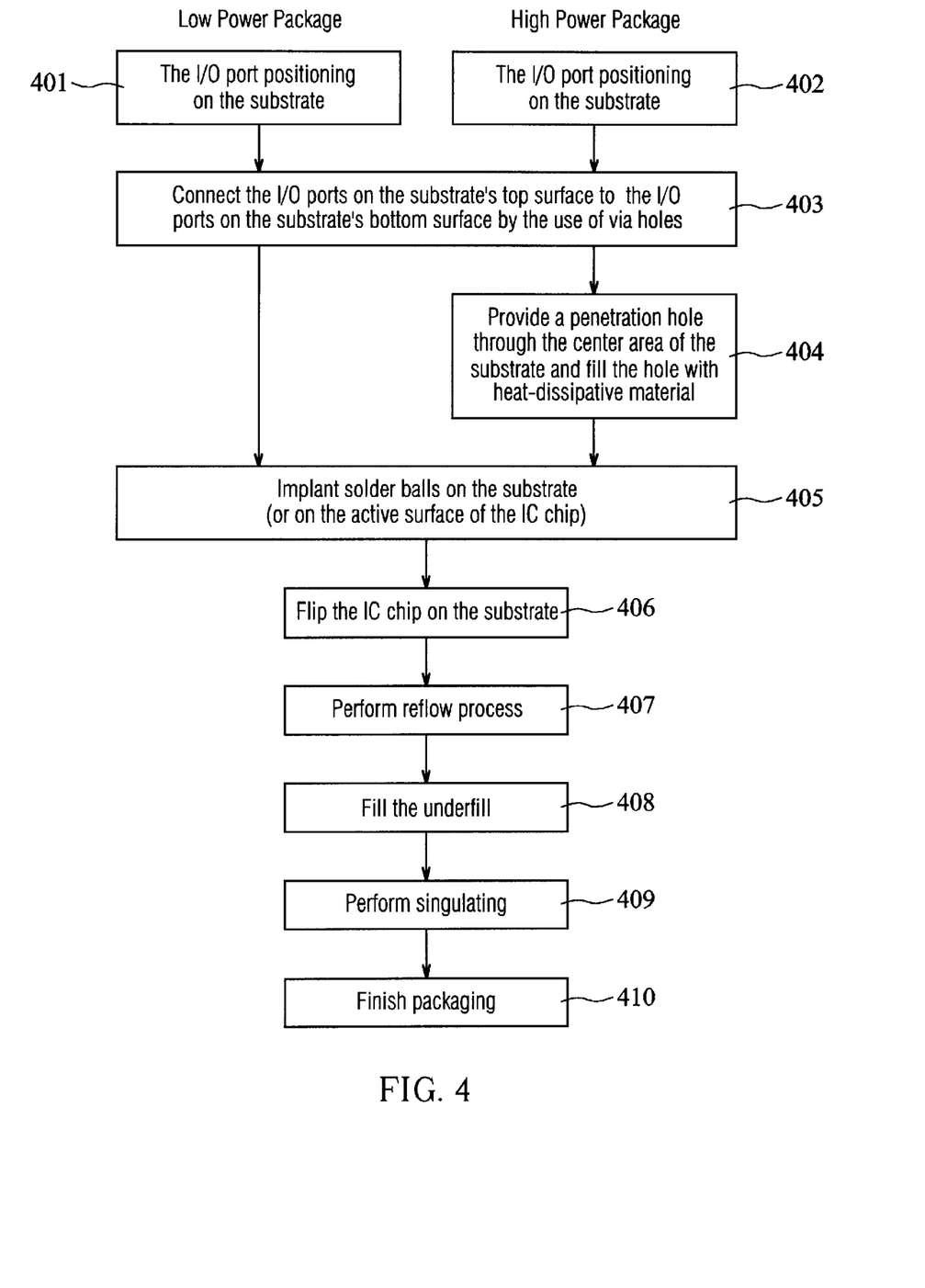
FIG. 4 is a flow chart showing the technical content and the fabrication process of the flip chip package of a monolithic microwave integrated circuit (MMIC) of the invention.

FIG. 4 is a flow chart showing the technical content and the fabrication process of the flip chip package of a monolithic microwave integrated circuit (MMIC) of the invention. The package structure and the technical content of the flip chip package of a monolithic microwave integrated circuit can be understood in accordance with the flow chart shown in FIG. 4. As shown in FIG. 4, first of all (step 401, 402), input/output ports (I/O ports) (not shown), having been connected to external circuit, are disposed on the top surface 501 of the substrate 5. These I/O ports include direct current (DC) source terminals, signal terminals, and ground terminals. Next (step 403), as shown in FIG. 5(b), a plurality of metal strips (acting as I/O ports) and via holes connected thereof respectively are provided in the periphery area 585 on the top surface 501 of the substrate 5. They are metal strips 511, 512, 513 and their corresponding via holes 521, 522, 523 on the first side 581, metal strips 518, 519, 520 and their corresponding via holes 528, 529, 530 on the second side 582, metal strips 514, 515, 516, 517 and their corresponding via holes 527 on the third side 583, as well as metal strips 541, 542, 543 and their corresponding via holes 524, 525, 526 on the fourth side 584. Etching method can be employed for providing these metal strips on the substrate 5, and the materials employed for these metal strips on both the top surface 501 and the bottom surface 502 of the substrate 5 can be gold (Au), copper (Cu), or aluminum (Al). As for the material for the metal strips on the IC chip 6, gold (Au), copper (Cu), or aluminum (Al) can also be employed.

Thereafter, similarly as shown in FIG. 5(c), a plurality of metal strips and via holes connected thereof respectively are provided in the periphery area 595 on the bottom surface 502 of the substrate 5. They are metal strips 571, 572, 573 and their corresponding via holes 521, 522, 523 on the first side 591, metal strips 578, 579, 580 and their corresponding via holes 528, 529, 530 on the second side 592, metal strip 577 and its corresponding via hole 527 on the third side 593, as well as metal strips 574, 575, 576 and their corresponding via holes 524, 525, 526 on the fourth side 594. The metal strips provided on the bottom surface 502 of the substrate 5 and acting as I/O ports are electrically connected to the metal strips, also acting as I/O ports, provided on the top surface 501 of the substrate 5 through these via holes.

Subsequently, same way is undertaken as shown in FIG. 5(d). A plurality of metal strips are provided in the periphery area 615 on the first surface 601 of the IC chip 6. They are metal strips 641, 642, 643 on the first side 611, metal strips 648, 649, 650 on the second side 612, metal strips 644, 645, 646, 647 on the third side 613, as well as metal strips 671, 672, 673 on the fourth side 614. Afterwards (step 405), solder bumps are implanted on the plurality of metal strips provided in the periphery area 615 on the first surface 601 of the above-mentioned IC chip 6. They are solder bumps 531, 532, 533 on the metal strips 641, 642, 643 on the first side 611 of the first surface 601 of the IC chip 6; solder bumps 538, 539, 540 on the metal strip 648, 649, 650 on the second side 612; solder bumps 534, 535, 536, 537 on the metal strips 644, 645, 646, 647 on the third side 613; as well as solder bumps 561, 562, 563 on the metal strip 671, 672, 673 on the fourth side 614. The metal strips provided on the first surface 601 of the IC chip 6 and acting as I/O ports are electrically connected to the metal strips, also acting as I/O ports, provided on the top surface 501 of the substrate 5 through these solder bumps. The solder bumps are employed to directly transmit the radio-frequency signals from the G-S-G or S-G I/O port structure on the MMIC to the G-S-G or S-G I/O port structure on the substrate where the G-S-D and S-G denote ground-signal-ground and signal-ground respectively. This method of the invention does not deteriorate the electrical characteristics of the MMIC while the conventional chip-and-wire method does. Then (step 406), the IC chip 6 is flipped over and having its active surface (the first surface) covered on the substrate 5. Thereafter (step 407), solder bumps are implanted by placing method and a reflow process is performed to accomplish the forming of the solder bumps. In addition to the placing method, the methods of deposition, electroplating, and stencil printing can also be employed for forming the solder bumps, and the material for the solder bumps can be a metal or alloy such as gold (Au), gold-tin (Au—Sn), gold-silicon (Au—Si), gold-germanium (Au—Ge), tin-lead (Sn—Pb), tin-silver (Sn—Ag), tin-lead-silver (Sn—Pb—Ag), indium (In), indium-tin (In—Sn), or indium-lead (In—Pb). It is worthwhile to mention that the plurality of solder bumps formed in the periphery area 615 on the first surface 601 of the IC chip 6 can also be implanted on the top surface 501 of the substrate 5.

In the IC chip 6 of the flip chip package of a monolithic microwave integrated circuit of the invention, the first surface 601 is the active area provided with electronic device, and the MMIC package 4 is to have the IC chip 6 flipped over and having its first surface 601 covering on the top surface 501 of the substrate 5. The circuit on the electronic device is electrically connected to the metal strips on the first surface 601 through the traces (not shown) extended from the circuit. The active area becomes the main source of heat generation since the active area can generate heat as the active device is operating. The material of the IC chip can be selected from gallium arsenide (GaAs) of III-V group compound or silicon (Si).

From hereon (step 408), underfill 7 is employed to fill around the solder bumps and the plurality of the metal strips which are connected to the solder bumps and are positioned on the IC chip's first surface. The underfill 7 is also employed to fill all the chinks around the top surface's metal strips of the substrate 5, and to cover the whole IC chip up to a height that is slightly higher than the thickness of the MMIC chip. Finally (step 409), a singulating process is performed to the substrate 5, and the packaging process is accomplished (step 410).

Figure 8:
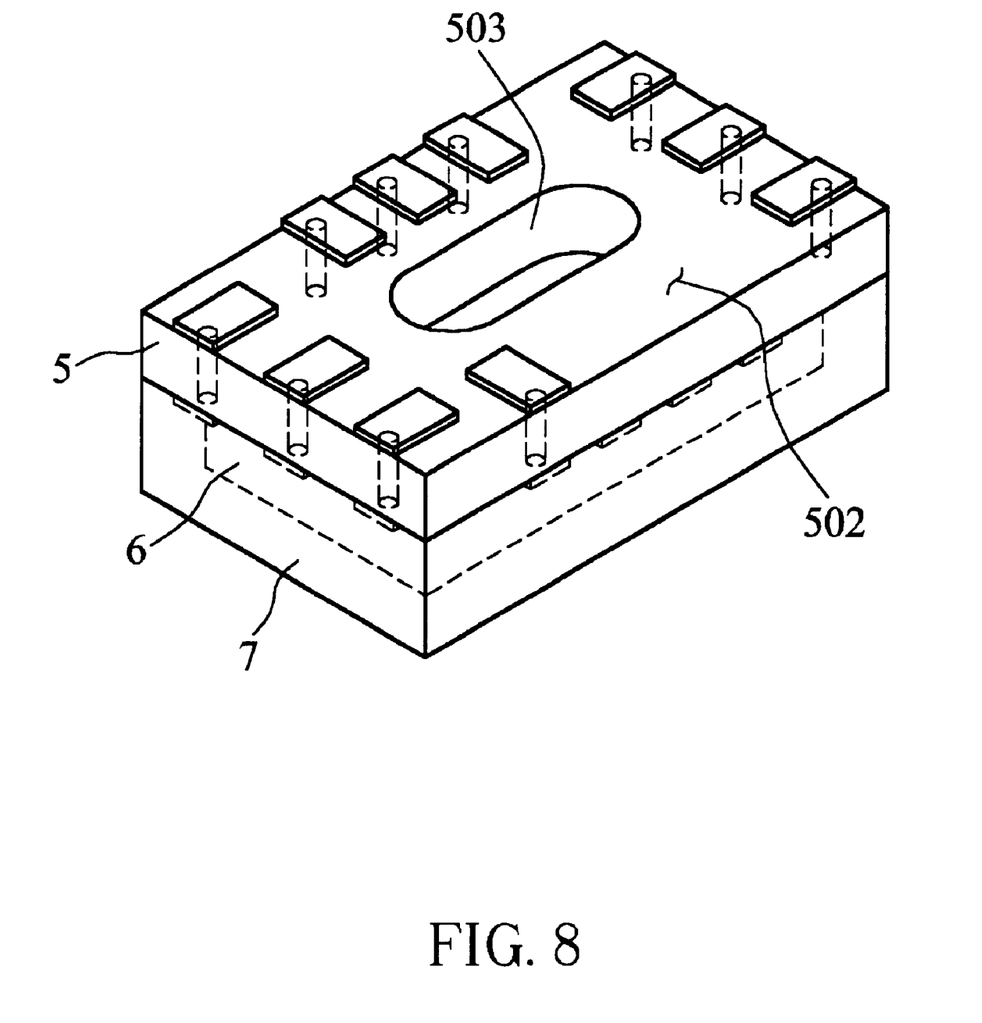
FIG. 8 is an isometric bottom view of a flip chip package of an MMIC of the second embodiment of the invention.
Figure 9:
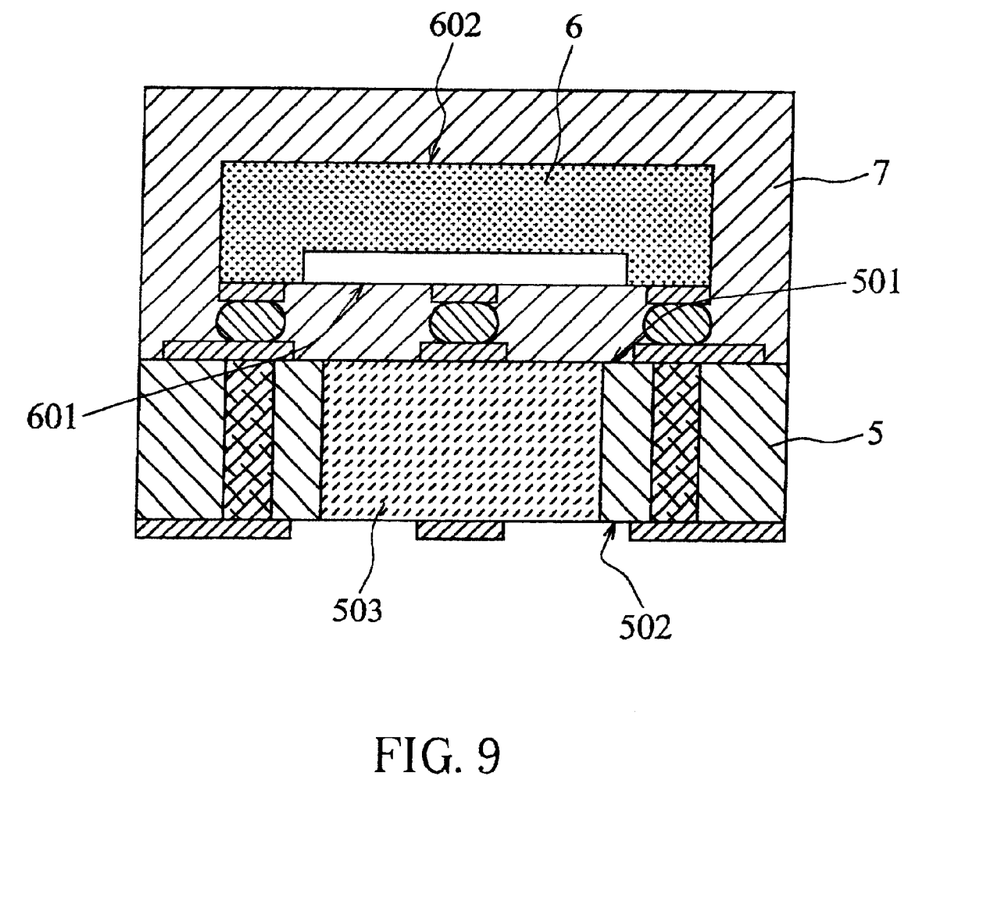
FIG. 9 is a cross-sectional view of a flip chip package of an MMIC of the second embodiment of the invention.

In the flip chip package of a monolithic microwave integrated circuit of the invention, the one applicable to the high power device is the "high power package" of the second embodiment of the invention. FIG. 8 is an isometric bottom view of a flip chip package of an MMIC of the second embodiment of the invention, and FIG. 9 is a cross-sectional view of a flip chip package of an MMIC of the second embodiment of the invention. Repeated illustration on the package structure of the flip chip package of an MMIC of the second embodiment of the invention shown in FIG. 8 and FIG. 9 is not necessary since the package structure is almost the same as that of the first embodiment of the invention. The only difference is a penetration hole 503 provided through the central area 586 of the top surface 501 and the central area 596 of the bottom surface 502 of the substrate 5. The material removed by penetrating the penetration hole is replaced by filling a heat-dissipative material which can be selected from boron nitride (BN), aluminum nitride (Al N), berylium oxide (BeO), aluminum oxide (Al$_2$O$_3$), or silicon carbide (Si C).

Among the first and second embodiments of the flip chip package of a monolithic microwave integrated circuit of the invention, the number and disposition of the metal strips, solder bumps, and via holes depends on the structure and dimension of the IC chip.

The flip chip package of an MMIC of the invention has the advantage of low cost, high operation frequency, fast in heat dissipation. In addition, this MMIC package of the invention can undertake mass production since the package size become smaller after the packaging process. What is more, the operation frequency can be improved since the package of the invention has less parasitic capacitance and parasitic inductance as the package of the prior art that has the chip-and-wire package. Therefore, the invention has the advantages what the package of the conventional MMIC can not achieve.

While the invention has been described by way of example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. A flip chip package of monolithic microwave integrated circuit (MMIC) comprising:

a substrate, having an top surface and a bottom surface, and each of the surfaces is divided respectively into a periphery area and a central area;

an integrated circuit chip (IC chip), having a first surface and a second surface, and each of the surfaces being divided respectively into a periphery area and a central area, and an MMIC package being made by flipping the IC chip to have its first surface covering on the top surface of the substrate, and the central area of the first surface having one or several active devices;

a plurality of metal strips, positioned on the IC chip's first surface and disposed in the periphery area of the IC chip's first surface, and these metal strips being electrically connected to the active devices on the first surface of the IC chip, wherein some of metal strips disposed in the periphery area of the IC chip's first surface are arranged in a ground-signal-ground or signal-ground pattern;

a plurality of solder bumps, implanted respectively on and being electrically connected to the first surface's metal strips of the plurality of IC chips;

a plurality of metal strips of the substrate's top surface, disposed in the periphery area of the substrate's top surface, and these metal strips being electrically connected to the plurality of solder bumps;

a plurality of metal strips of the substrate's bottom surface, disposed in the periphery area of the substrate's bottom surfaces;

a plurality of via holes, penetrating through the substrate and being electrically connected to the plurality of metal strips on the substrate's top surface and to the plurality of metal strips on the substrate's bottom surface respectively; and an underfill, filling the solder bumps and the plurality of the metal strips which are connected to the solder bumps and are positioned on the IC chip's first surface, also filling all the chinks around the top surface's metal strips of the substrate, and covering the whole IC chip up to a height that is slightly higher than the thickness of the IC chip;

wherein both some of the plurality of metal strips disposed in the periphery area of the substrate's top and bottom surfaces are arranged in a ground-signal-ground or a signal-ground pattern.

2. The flip chip package of MMIC of claim 1, wherein the plurality of solder bumps are implanted on and electrically connected to the top surface's metal strips of the substrate, and also being electrically connected to the first surface's metal strips of the IC chip.

3. The flip chip package of MMIC of claim 1, wherein the plurality of the first surface's metal strips of the IC chip are input/output (I/O) ports and ground terminals of the IC chip.

4. The flip chip package of MMIC of claim 1, wherein the material of the plurality of the first surface's metal strips of the IC chip is selected from the group of metal consisting of gold, copper, and aluminum.

5. The flip chip package of MMIC of claim 1, wherein the material of the plurality of the top surface's metal strips and the plurality of the bottom surface's metal strips of the substrate is selected from the group of metal consisting of gold, copper, and aluminum.

6. The flip chip package of MMIC of claim 1, wherein the material of the IC chip is selected from the group consisting of gallium arsenide (GaAs) of III-V group compound or silicon (Si).

7. The flip chip package of MMIC of claim 1, wherein the material of the solder bumps is selected from the group of metal or alloy consisting of gold (Au), gold-tin (Au—Sn), gold-silicon (Au—Si), gold-germanium (Au—Ge), tin-lead (Sn—Pb), tin-silver (Sn—Ag), tin-lead-silver (Sn—Pb—Ag), indium (In), indium-tin (In—Sn), indium-lead (In—Pb).

8. The flip chip package of MMIC of claim 1, wherein the method for forming the solder bumps is selected from the group consisting of deposition, electroplating, stencil printing, wire bonding, solder ball implanting.

9. The flip chip package of MMIC of claim 1, wherein the material of the via holes is selected from the group of metal consisting of gold,, silver, copper, and aluminum.

10. The flip chip package of MMIC of claim 1, wherein the forming method of metal strips on the top and bottom surfaces of the substrate and on the first surface of the IC chip is etching.

11. The flip chip package of MMIC of claim 1, wherein the number and disposition of all the metal strips and via holes depend on the structure and size of the IC chip.

12. The flip chip package of MMIC of claim 1, wherein a penetration hole is provided in the central areas of the top and bottom surfaces of the substrate and the material removed by penetrating the penetration hole is replaced by filling a heat-dissipative material.

13. The flip chip package of MMIC of claim 12, wherein the heat-dissipative material is selected from the group consisting of boron nitride (BN), aluminum nitride (Al N), berylium oxide (Be O), aluminum oxide (Al$_2$O$_3$), silicon carbide (Si C).

14. The flip chip package of MMIC of claim 1, wherein the material of the underfill is thermosetting resin.

* * * * *